(12) United States Patent
Shibuya et al.

(10) Patent No.: US 7,944,446 B2
(45) Date of Patent: May 17, 2011

(54) DEVICE AND METHOD FOR DISPLAYING DELAY ANALYSIS RESULTS, AND COMPUTER PRODUCT

(75) Inventors: Toshiyuki Shibuya, Kawasaki (JP); Katsumi Homma, Kawasaki (JP); Izumi Nitta, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 736 days.

(21) Appl. No.: 12/002,504

(22) Filed: Dec. 17, 2007

(65) Prior Publication Data

US 2008/0195941 A1    Aug. 14, 2008

(30) Foreign Application Priority Data

Feb. 13, 2007    (JP) ................. 2007-031867

(51) Int. Cl.
*G06T 11/20* (2006.01)
*G06F 15/16* (2006.01)

(52) U.S. Cl. .......... 345/440; 345/440.1; 345/440.2; 345/441; 345/442; 716/108; 716/113

(58) Field of Classification Search ............... 716/6–12, 716/108, 113; 345/440–442
See application file for complete search history.

(56) References Cited

U.S. PATENT DOCUMENTS

| | | | | |
|---|---|---|---|---|
| 5,889,677 A * | 3/1999 | Yasuda et al. | ..... | 716/6 |
| 6,240,541 B1 * | 5/2001 | Yasuda et al. | ..... | 716/6 |
| 6,412,101 B1 * | 6/2002 | Chang et al. | ..... | 716/10 |
| 7,308,381 B2 * | 12/2007 | Yonezawa | ..... | 702/179 |
| 2003/0037093 A1 * | 2/2003 | Bhat et al. | ..... | 709/105 |
| 2003/0051220 A1 * | 3/2003 | Okada et al. | ..... | 716/12 |
| 2004/0167756 A1 * | 8/2004 | Yonezawa | ..... | 703/2 |
| 2005/0081171 A1 * | 4/2005 | Kawano et al. | ..... | 716/6 |
| 2005/0283750 A1 * | 12/2005 | Kosugi et al. | ..... | 716/11 |
| 2006/0236279 A1 | 10/2006 | Homma | | |
| 2007/0050742 A1 * | 3/2007 | Yonezawa | ..... | 716/6 |
| 2008/0034338 A1 * | 2/2008 | Hosono | ..... | 716/6 |
| 2008/0072198 A1 * | 3/2008 | Celik et al. | ..... | 716/6 |

FOREIGN PATENT DOCUMENTS

| | | |
|---|---|---|
| JP | 08-278998 | 10/1996 |
| JP | 2004-252831 | 9/2004 |
| JP | A 2005-79162 | 3/2005 |
| JP | 2005-122298 | 5/2005 |
| JP | 2006-268479 | 10/2006 |

* cited by examiner

*Primary Examiner* — Jin-Cheng Wang
(74) *Attorney, Agent, or Firm* — Greer, Burns & Crain, Ltd.

(57) ABSTRACT

Fluctuations of cumulative delay value and delay dispersion in a path of a circuit are displayed graphically. Cumulative delay values of circuit elements in the path are obtained from delay analysis results of the circuit and dispersion is obtained from a probability density distribution of the delay of the circuit elements. Corresponding to the location of the circuit element in the path, the former and the latter are plotted on a coordinate plane.

20 Claims, 14 Drawing Sheets

FIG.2A

CIRCUIT ELEMENT LIBRARY 200

| CIRCUIT ELEMENT | DELAY | | SLACK | | ROUNDING | | LOAD CAPACITY | | DELAY SENSITIVITY |
|---|---|---|---|---|---|---|---|---|---|
| | MEDIAN | 3σ VALUE | MEDIAN | 3σ VALUE | MEDIAN | 3σ VALUE | MEDIAN | 3σ VALUE | |
| C1 | 20 | 10 | 4 | 10 | 20 | 9 | 5 | 1 | 0.3 |
| C2 | 30 | 5 | 4 | 10 | 32 | 10 | 6 | 1 | 0.4 |
| C3 | 40 | 12 | 0 | 0 | 44 | 11 | 3 | 1 | 0.04 |
| C4 | 60 | 3 | 0 | 0 | 55 | 13 | 6 | 10 | 0 |
| ... | ... | ... | ... | ... | ... | ... | ... | ... | ... |
| Cn | 50 | 8 | ... | ... | ... | ... | ... | ... | 0.5 |

| PATH | CORRELATION COEFFICIENT | | | |
|---|---|---|---|---|
| P1 | | C1 | C2 | C3 |
| | C1 | | 0 | 0.8 |
| | C2 | 0 | | 0.1 |
| | C3 | 0.8 | 0.1 | |
| P2 | | C1 | C2 | C5 |
| | C1 | | 0 | 0.5 |
| | C2 | 0 | | 0.3 |
| | C5 | 0.5 | 0.3 | |
| ⋮ | ⋮ | ⋮ | ⋮ | ⋮ |
| Pn | · · · · · · · · · · · · · · · · · · · | | | |

| PATH | CIRCUIT ELEMENT | CUMULATIVE DELAY VALUE [ps] | |
|---|---|---|---|
| | | STA | SSTA |
| P1 | C1 | N1 | M1 |
| | C2 | N2 | M2 |
| | C3 | N3 | M3 |
| P2 | C1 | N4 | M4 |
| | C2 | N5 | M5 |
| | C5 | N6 | M6 |
| P3 | C4 | N7 | M7 |
| | C2 | N8 | M8 |
| | C3 | N9 | M9 |
| ⋮ | ⋮ | ⋮ | ⋮ |
| Pn | ... | ... | ... |

DEVICE AND METHOD FOR DISPLAYING DELAY ANALYSIS RESULTS, AND COMPUTER PRODUCT

CROSS-REFERENCE TO RELATED APPLICATIONS

This application is based upon and claims the benefit of priority from the prior Japanese Patent Application No. 2007-031867, filed on Feb. 13, 2007, the entire contents of which are incorporated herein by reference.

BACKGROUND OF THE INVENTION

1. Field of the Invention

The present invention relates to a technology for displaying delay analysis results.

2. Description of the Related Art

In recent years, with the minimization of integrated semiconductor circuits, the effect of statistical factors such as processing variation, source voltage reduction, and crosstalk has increased, thereby magnifying circuit delay fluctuations. In conventional static timing analysis (STA), although ample delay margin is secured for these circuit delay fluctuations, timing design is becoming more difficult with expanding delay margins.

Hence, needs are rising for statistical static timing analysis (SSTA) that can reduce unnecessary delay margin by precisely determining statistical factors. As a method to estimate circuit delay using SSTA, the following method has been disclosed.

Variation of gate dimension layout is computed based on variation of a gate dimension either variable or non-variable with predetermined values of gate length and gate width of a transistor. Variation is also computed for the processing of gate dimension that correlates to dopant fluctuations. The circuit delay is estimated using information concerning these variations of gate dimension (see, for example, Japanese Patent Application Laid-Open Publication No. 2005-079162).

By the conventional technique, however, an analysis result obtained by SSTA may not give enough information to understand which path or circuit element of the circuit was affected and how, in terms of the delay of the entire circuit.

For example, without supplementary information, determination of delay dispersion characteristics or a bottleneck circuit element only from a result of numerated values or the like was difficult causing problems such as increased design load and a prolonged design period.

Dispersion of delay by statistical factors is difficult to automatically estimate by SSTA. For example, even if delay of a critical path is reduced by 10 picoseconds (ps), delay of the entire circuit is not expected to directly be reduced by 10 ps.

Therefore, SSTA requires manual circuit modification for timing optimization while taking statistical factors into account. Thus, in the design field, an analysis tool that enables a user to interpret analysis results to estimate circuit delay by SSTA is desirable.

SUMMARY OF THE INVENTION

It is an object of the present invention to at least solve the above problems in the conventional technologies.

A computer-readable recording medium, according to one aspect of the present invention, stores therein a computer program for displaying delay analysis results of a target circuit and that causes a computer to execute displaying, on a display screen, a coordinate plane including a first axis indicating a position of a circuit element in a path of the target circuit and a second axis indicating a cumulative delay value of the circuit element; and displaying, on the coordinate plane, the delay analysis results in a form of a first graph showing fluctuations of a cumulative delay value in the path.

A device for displaying delay analysis results of a target circuit, according to another aspect of the present invention, includes a displaying unit that displays, on a display screen, a coordinate plane including a first axis indicating a position of a circuit element in a path of the target circuit and a second axis indicating a cumulative delay value of the circuit element, and on the coordinate plane, displays the delay analysis results in a form of a graph showing fluctuations of a cumulative delay value in the path.

A method for displaying delay analysis results, according to still another aspect of the present invention, includes displaying, on a display screen, a coordinate plane including a first axis indicating a position of a circuit element in a path of the target circuit and a second axis indicating a cumulative delay value of the circuit element; and displaying, on the coordinate plane, the delay analysis results in a form of a first graph showing fluctuations of a cumulative delay value in the path.

The other objects, features, and advantages of the present invention are specifically set forth in or will become apparent from the following detailed description of the invention when read in conjunction with the accompanying drawings.

BRIEF DESCRIPTION OF THE DRAWINGS

FIGS. 2A and 2B are schematics of stored contents of a circuit element library;

FIG. 4 is a schematic of an exemplary delay analysis result list;

DETAILED DESCRIPTION OF THE PREFERRED EMBODIMENTS

Referring to the accompanying drawings, exemplary embodiments according to the present invention are explained in detail below.

Exemplary embodiments according to the present invention will be explained in detail below with reference to accompanying drawings.

Figure 1:
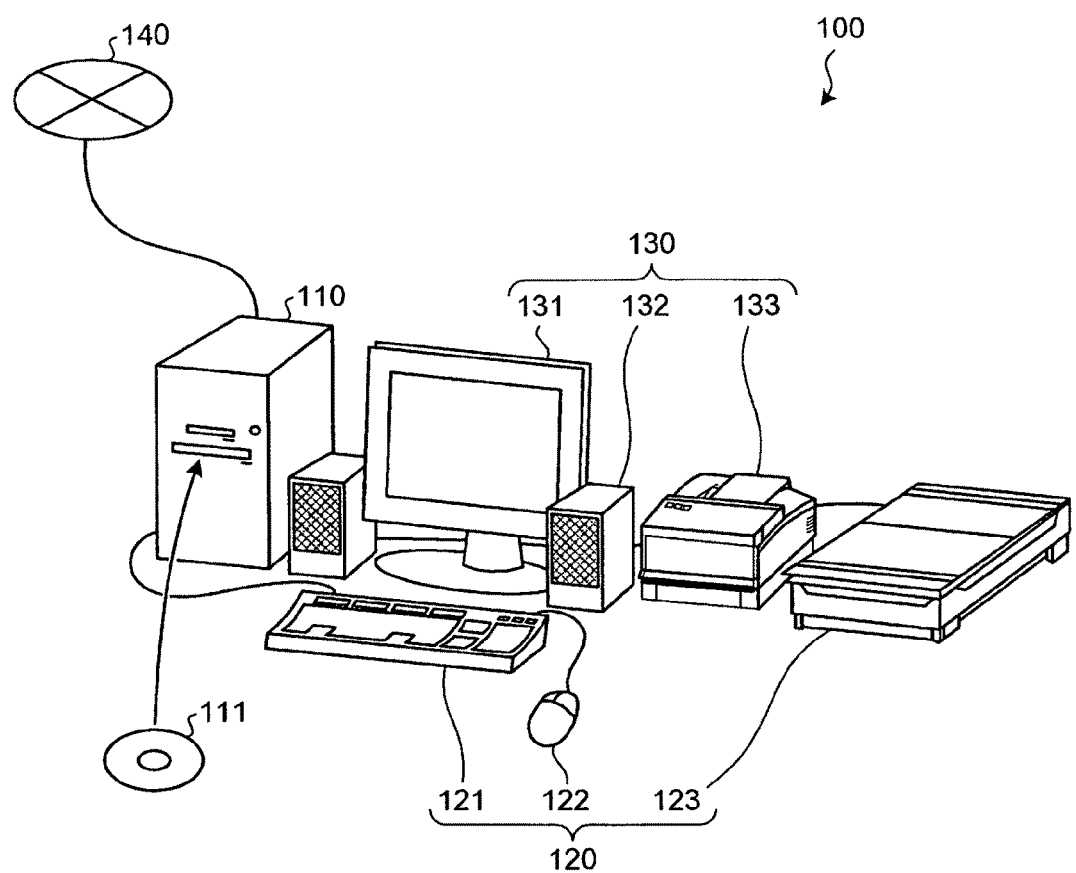
FIG. 1 is a block diagram of a device for displaying delay analysis results according to an embodiment of the present invention.

FIG. 1 is a block diagram of the device according to the embodiment of the present invention. A device 100 for displaying delay analysis results includes a computer main body 110, input devices 120, and output devices 130 and can be connected to a network 140, such as a local area network (LAN), a wide area network (WAN) and the Internet, through a router or modem not shown.

The computer main body 110 includes a central processing unit (CPU), a memory, and an interface. The CPU is responsible for overall control of the device 100. The memory includes a read-only memory (ROM), a random access memory (RAM), a hard disk (HD), an optical disc 111, and a flash memory. The memory is used as a work area of the CPU.

The memory has various programs stored thereon, which are loaded in accordance with instructions from the CPU. On the HD and the optical disc 111, data read/write is controlled by disc drives. The optical disc 111 and the flash memory are removable from the computer main body 110. The interface controls input from the input devices 120, output to the output devices 130, and transmission/reception to/from the network 140.

The input devices 120 include, for example, a keyboard 121, a mouse 122, and a scanner 123. The keyboard 121 includes keys for inputting characters, numerical characters, various instructions, etc., to input data. Alternatively, a touch panel may be used. The mouse 122 moves a cursor, selects an area, and/or moves and/or resizes a window. The scanner 123 optically reads an image. The read image is captured as image data and stored in the memory in the computer main body 110. The scanner 123 may have an optical character recognition (OCR) function.

The output devices 130 include, for example, a display 131, a speaker 132, and a printer 133. The display 131 displays a cursor, icons and/or tool boxes as well as data such as documents, images, and function information. The speaker 132 outputs sound such as sound effects and read-out sound. The printer 133 prints image data and document data.

FIGS. 2A and 2B are schematics of contents stored in a circuit element library 200. As illustrated in FIG. 2A, the circuit element library 200 stores circuit element information 200-1 to 200-$n$ for each circuit element in a circuit to be analyzed.

The circuit element information 200-1 to 200-$n$ includes probability density distribution parameters of circuit element name, delay, slack, slope (slew), and load capacity as well as parameters of delay sensitivity for circuit elements. Details of the delay, slack, slew, load capacity, and delay sensitivity are described hereinafter.

Specifically, the circuit element information 200-1 to 200-$n$ includes probability density distributions indicating statistical dispersions of delay, slack, slew, and load capacity of circuit elements, including median values and $3\sigma$ values for the probability density distributions as the probability density distribution parameters.

The median value is one of the representative values of each probability density distribution, located in the center of distribution function when a finite number of data (e.g., delay value) are sorted. The $3\sigma$ value is a standard deviation $\sigma$, which shows an extent of distribution, and that is multiplied by three.

For example, regarding a circuit element C1, the circuit element library 200 includes a probability density distribution parameters '20, 10' for delay, '4, 10' for slack, '20, 9' for slew, '5, 1' for load capacity, and a parameter '0.3' for delay sensitivity.

The circuit element library 200 also stores a correlation table of mutual correlation among circuit elements in a path.

As shown in FIG. 2B, the correlation table 220 includes correlation coefficients of mutual correlations among the circuit elements for each path. For example, the correlation table 220 includes correlation coefficients '0' for correlation between the circuit elements C1 and C2 of a path P1 and '0.8' for correlation between the circuit elements C1 and C3. Details of the correlation coefficients of mutual correlations among circuit elements are described hereinafter.

While the circuit element library 200 shown in FIG. 2A includes $3\sigma$ values of probability density distribution for each circuit element, the circuit element library 200 may include, for example, $2\sigma$ values of probability density distribution as a probability density parameter, or may include multiple $\sigma$ values, such as both $2\sigma$ and $3\sigma$ values.

The circuit element library 200 may also include information concerning target performance of the circuit. Specifically, as a minimum requirement, the delay value (e.g., 3000 ps) of the circuit is included as information concerning the target performance. A buffer, an inverter, a logic gate, and wiring may be named as circuit elements.

Figure 3:
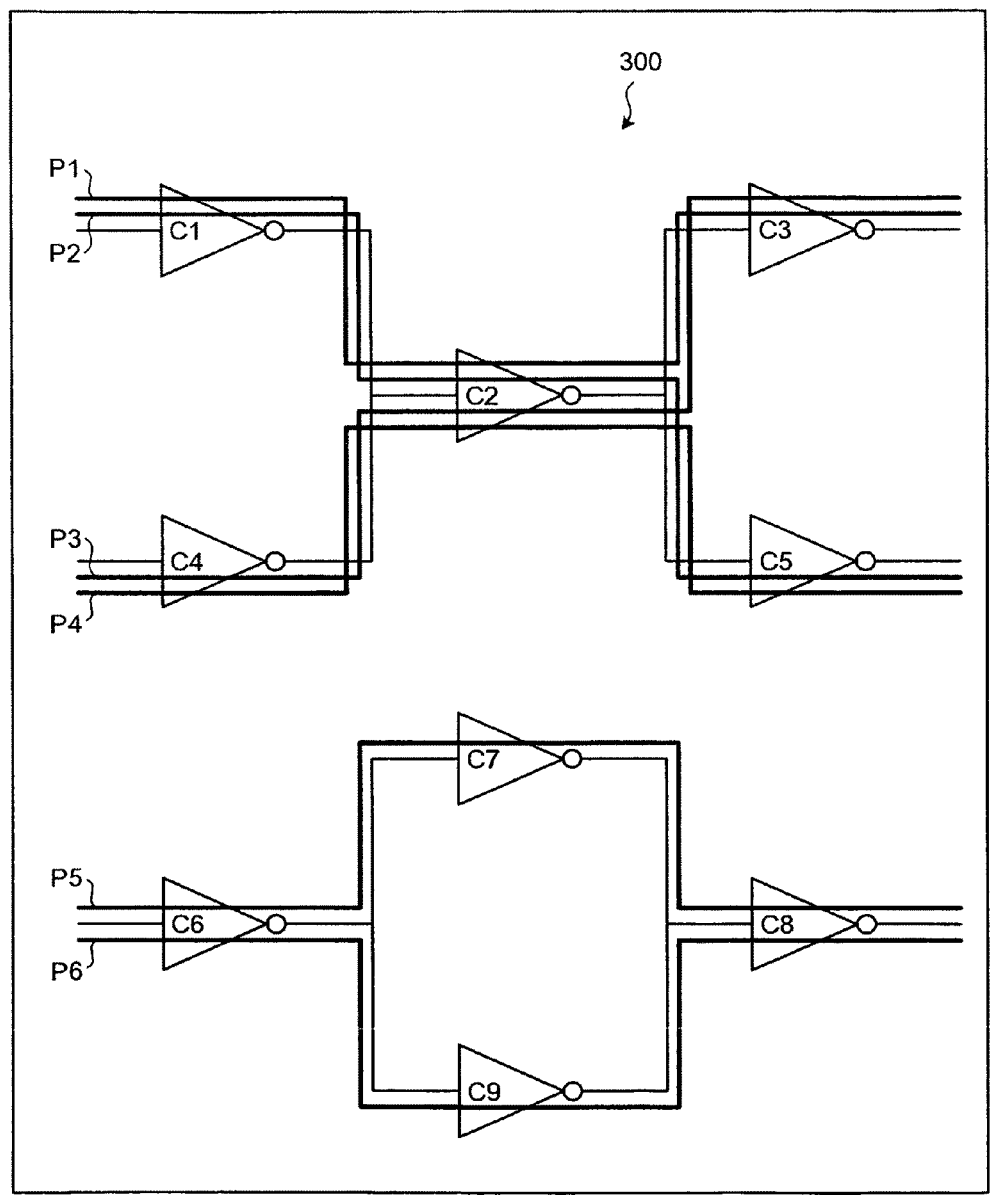
FIG. 3 is an exemplary circuit diagram of a circuit to be analyzed.

FIG. 3 is an exemplary circuit diagram of a circuit 300 that is to be analyzed and is according to the embodiment. The figure depicts an excerpt from the circuit 300. The circuit 300 includes circuit elements C1 to C9.

In the circuit 300, a path P1 is a path (route) passing through the circuit elements C1, C2, and C3; a path P2 is a path passing through the circuit elements C1, C2, and C5; a path P3 is a path passing through the circuit elements C4, C2, and C3; a path P4 is a path passing through the circuit elements C4, C2, and C5. A path P5 is a path passing through the circuit elements C6, C7, and C8 and a path P6 is a path passing through the circuit elements C6, C9, and C8.

FIG. 4 is a schematic of an exemplary delay analysis result list 400 as a delay analysis result according to the embodiment. The delay analysis result list 400 includes descriptions of delay analysis results obtained by STA and SSTA of the circuit 300. Specifically, the delay analysis result list 400 includes descriptions, for paths P1 to Pn, of circuit elements forming each path and delay values aggregated for the circuit elements.

STA is a method that sums up uniformly estimated delay values (worst-case) of circuit elements C1 to C9 in the circuit 300. SSTA is a method that, by statistically handling delay of an entire circuit, optimizes timing estimation by providing delay dispersions of the circuit elements C1 to C9 in the circuit 300 as a probability density distribution.

For example, the path P1 includes the circuit elements C1, C2, and C3. Cumulative delay values of the circuit element C1 in the path P1 are N1 and M1 that are results of STA and of SSTA, respectively.

The cumulative delay value is an aggregate of delay values of circuit elements in a path, and the cumulative delay values of the last circuit elements in the paths P1 to Pn are the delay values of the paths P1 to Pn. Specifically, the cumulative delay value of STA is obtained by simply summing up delay values (worst-cases) of circuit elements.

The cumulative delay value of SSTA is obtained by statistically handling delay dispersions of circuit elements using, for example, the circuit element library 200 shown in FIG. 2A.

Figure 5:
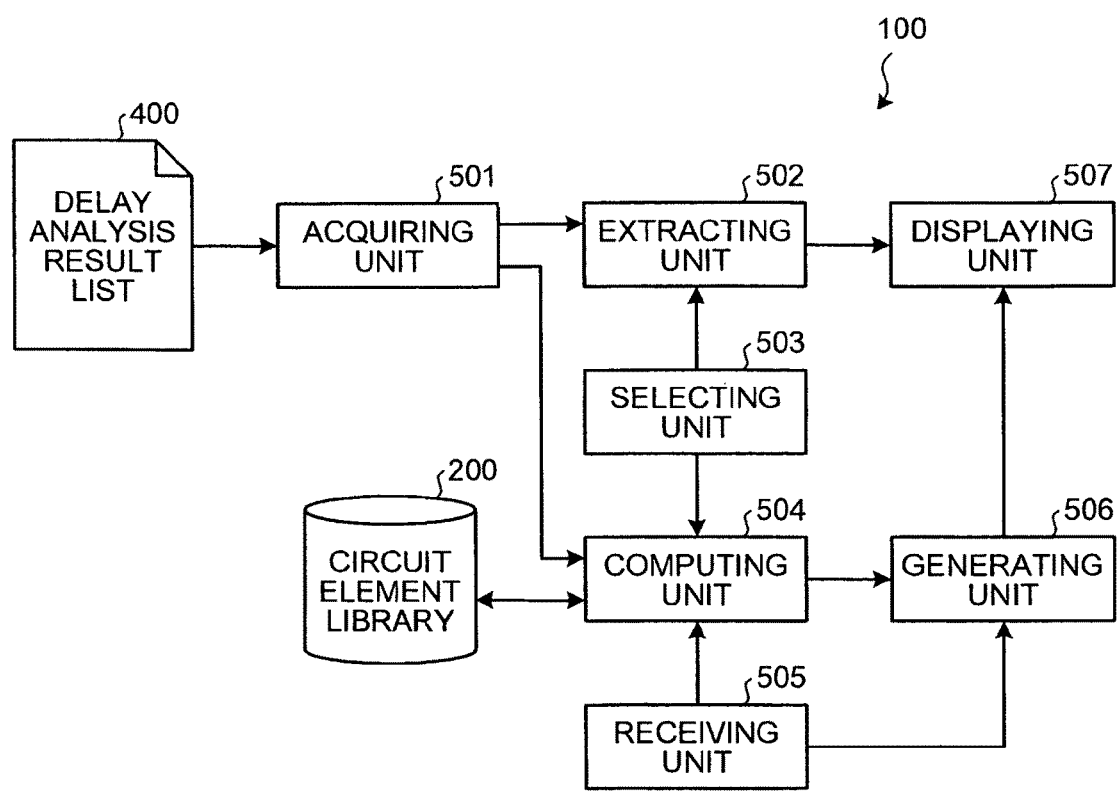
FIG. 5 is a functional diagram of the device.

FIG. 5 is a functional diagram of the device 100. The device 100 includes an acquiring unit 501, an extracting unit 502, a selecting unit 503, a computing unit 504, a receiving unit 505, a generating unit 506, and a displaying unit 507.

These functions 501 to 507 may be realized by a CPU executing programs stored in a memory. Output data from the functions 501 to 507 are stored in the memory. As shown in FIG. 5, a destination function of a connection (indicated by arrow heads) reads, from the memory, output data of a source function connected thereto, commanding the CPU to execute a program for the destination function.

The acquiring unit 501 acquires a delay analysis result of a circuit to be analyzed. Specifically, the acquiring unit 501 acquires, for example, the delay analysis result list 400 shown in FIG. 4. The delay analysis result may be an analysis result of either SSTA or STA.

The delay is an indicator of the time required for signal input/output between arbitrary circuit elements in a circuit, such as, delay time (delay value) required for signal input/output between flip-flops.

Specifically, the acquiring unit 501 may acquire the delay analysis result list 400 that is directly input to the device 100, or may acquire the delay analysis result list 400 from an external computer system via the network 140. The acquiring unit 501 acquires the delay analysis result and stores the delay analysis result in the memory.

The extracting unit 502 extracts, from the delay analysis result acquired by the acquiring unit 501, information concerning a cumulative delay value of a circuit element forming an arbitrary path in the circuit 300. Specifically, the extracting unit 502 reads the delay analysis result list 400 stored in the memory and from the delay analysis result list 400, extracts information concerning a cumulative delay value of a circuit element forming an arbitrary path.

For example, the extracting unit 502 extracts, from the delay analysis result list 400, information concerning cumulative delay values for the circuit elements C1, C2, and C3 forming the path P1. The extracting unit 502 extracts information concerning cumulative delay values and stores the extracted information in the memory.

The selecting unit 503 receives selection of an arbitrary path in the circuit to be analyzed. An input to select an arbitrary path is performed by a user operating the input device 120, such as the keyboard 121 or the mouse 122. A path selection display for selecting an arbitrary path is described hereinafter. The extracting unit 502 extracts, from the delay analysis result when the selecting unit 503 receives a path selection, information concerning the cumulative delay value of a circuit element forming the path selected.

The displaying unit 507 displays, on the display 131, a graph showing fluctuations of a cumulative delay value in a path. The graph is displayed by associating cumulative delay values of circuit elements (obtained from delay analysis of the circuit) with positions of the circuit elements forming an arbitrary path in the circuit 300, on a coordinate plane consisting of a first axis that specifies positions of circuit elements, and a second axis that indicates cumulative delay values of the circuit elements.

Specifically, the generating unit 506 reads information concerning the cumulative delay value of circuit elements stored in the memory, and generates a graph showing fluctuations of the cumulative delay values in a path. The displaying unit 507 displays the graph generated by the generating unit 506 on the display 131. At this time, the displaying unit 507 may display circuit information of the circuit 300 together with reference to a netlist of the circuit 300.

The computing unit 504 computes information concerning the delay dispersion for circuit elements with reference to the probability density distribution of delay of the circuit elements. Specifically, the computing unit 504 reads circuit element information from the circuit element library 200 and computes information concerning delay dispersion for the circuit elements.

A computing method of information concerning delay dispersion is explained exemplifying the path P1. Hereinafter, an indicator 'Ln' is used to indicate cumulative dispersion of delay of a circuit element Cn. The cumulative dispersion is the cumulative delay dispersion from a first circuit element to an arbitrary circuit element in a path.

In the case that indicators L1, L2, and L3 respectively indicating cumulative delay dispersions of the circuit elements C1, C2, and C3 are computed, the computing unit 504 refers to the circuit element library 200. The path P1 includes the circuit elements C1, C2, and C3. The computing unit 504 computes indicators of delay dispersions of the circuit elements C1, C2, and C3 using probability density distribution parameters of the circuit elements C1, C2, and C3 by equation 1. Below, an indicator 'Gn' is used to indicate delay dispersion of a circuit element Cn.

$$Gn = (3\sigma \text{ value of probability density distribution of delay of a circuit element } Cn) \times 2 \quad (1)$$

G1 indicating delay dispersion of the circuit element C1 is computed as 'G1=10×2=20' by referring to the circuit element library 200. G2 indicating delay dispersion of the circuit element C2 is 'G2=5×2=10', and G3 indicating delay dispersion of the circuit element C3 is 'G3=12×2=24'.

The computing method is not limited to the above method as long as the indicator Gn, which indicates delay dispersion of the circuit elements C1, C2, and C3, is computed under a criterion uniform among all circuit elements in a path.

Indicators L1, L2, and L3 respectively indicating cumulative delay dispersions of the circuit elements C1, C2, and C3 are computed by equation 2.

$$Ln = \sum_{i=1}^{n} Gi \quad (2)$$

Therefore, the indicators L1, L2, and L3 indicating cumulative delay dispersions of the circuit elements C1, C2, and C3 are computed by aggregating the indicators G1, G2, and G3 that indicate the delay dispersions of the circuit element C1, C2, and C3. Specifically, the indicator L1 indicating cumulative delay dispersion of the circuit element C1 is 'L1=G1=20'.

The indicators L2 and L3 indicating cumulative delay dispersions of the circuit elements C2 and C3 are 'L2=G1+G2=30' and 'L3=G1+G2+G3=54', respectively. A computation result computed by the computing unit 504 is stored in the memory.

The computing unit 504 computes information concerning slack dispersion for circuit elements with reference to the probability density distribution of slack of the circuit elements. The slack indicates the slackness of a delay value against target performance.

For example, target performance and actual operation time are supposed to be 300 ps and 267 ps, respectively, for one circuit. In this case, there is a margin of 33 ps against the target performance, ensuring that the target performance may be satisfied even if the operation time is slowed by 33 ps.

Thus, this circuit is regarded to have a positive slack of 33 ps. On the other hand, if operation time of the circuit is supposed to be 317 ps, the operation delays by 17 ps against the target performance. Hence, this circuit is regarded to have a negative slack of 17 ps.

Information concerning slack dispersion may be computed by a similar computing method as that for information concerning delay dispersion. Specifically, an indicator Gn indicating slack dispersion of a circuit element Cn is computed by substituting '3σ value of probability density distribution of slack of a circuit element Cn' for '3σ value of probability density distribution of delay of a circuit element. Cn' in equation 1. An indicator Ln indicating cumulative slack dispersion of the circuit element Cn may then be computed by substituting the indicator Gn indicating slack dispersion of the circuit element Cn into equation 2.

The computing unit 504 also computes information concerning dispersion of slew for circuit elements with reference to probability density distribution of the slew of the circuit elements. The slew is explained with the assumption that a clock changes from '0' to '1' if the voltage at an exemplary circuit element reaches 0.5 volts (V) against a target voltage of 1 V.

In this case, the time required for the voltage applied to the circuit element to rise from 0 V to 0.5 V is regarded as the delay value of the circuit element, i.e., the clock changes from '0' to '1' when the voltage applied to the circuit element reaches 50% of the target voltage. The time required for the voltage applied to the circuit element to rise from 10% to 90% of the target voltage is defined as slew, i.e., the time required for the voltage to rise from 0.1 V to 0.9 V.

Information concerning slew dispersion may be computed by a similar computing method as that for information concerning delay dispersion. Specifically, an indicator Gn indicating slew dispersion of a circuit element Cn is computed by substituting '3σ value of probability density distribution of slew of a circuit element Cn' for '3σ value of probability density distribution of delay of a circuit element Cn' in equation 1. An indicator Ln indicating cumulative slew dispersion of the circuit element Cn may then be computed by substituting indicator Gn indicating slew dispersion of the circuit element Cn into equation 2.

The computing unit 504 also computes information concerning dispersions of load capacities of circuit elements with reference to probability density distribution of load capacities of circuit elements. The load capacity indicates capacitance and coupling of wiring in the circuit 300.

Information concerning load capacity dispersion may be computed by a similar computing method as that for information concerning delay dispersion. Specifically, an indicator Gn indicating load capacity dispersion of a circuit element Cn is computed by substituting '3σ value of probability density distribution of load capacity of a circuit element Cn' for '3σ value of probability density distribution of delay of a circuit element Cn' in equation 1. An indicator Ln indicating cumulative load capacity dispersion of the circuit element Cn may then be computed by substituting indicator Gn indicating load capacity dispersion of the circuit element Cn into equation 2.

The computing unit 504 computes information concerning dispersions of cumulative values of delay, slack, slew, and load capacity when the selecting unit 503 receives selection of an arbitrary path.

The displaying unit 507 displays a graph showing fluctuations of a cumulative delay value in a path, and a graph showing fluctuations of delay dispersion in the path. The graphs are displayed by associating (on a coordinate plane) dispersion, which is obtained from probability density distribution of delays of circuit elements, with positions of the circuit elements.

The displaying unit 507 may display a graph showing fluctuations of cumulative delay dispersion aggregated from a first circuit element to an arbitrary circuit element in a path as well as a graph showing fluctuations of a cumulative delay value in the path.

The displaying unit 507 may also display a graph formed by combining the graphs showing fluctuations of the cumulative delay value and fluctuations of the delay dispersion in the path by associating (on a coordinate plane) the cumulative delay value of circuit elements with the delay dispersion of the circuit elements.

Specifically, the displaying unit 507 reads a computation result, which is computed by the computing unit 504 and stored in the memory, and based on the computation result, graphically displays, on the coordinate plane, information concerning delay dispersion of circuit elements.

Specifically, the generating unit 506 generates, based on the read computation result, display data of delay dispersions of the circuit elements. For example, the display data may indicate delay dispersions of the circuit elements by widths that expand in a direction of the second axis or by values, diagrams, or marks.

The delay dispersions of circuit elements may be indicated by a third axis that is different from both the first axis, which specifies the positions of circuit elements forming an arbitrary path, and from the second axis, which indicates cumulative delay values of the circuit elements. The displaying unit 507 displays display data generated by the generating unit 506 on the display 131.

In an exemplary case of the path P1, indicators L1, L2, and L3 respectively indicating cumulative delay dispersions of the circuit elements C1, C2, and C3 are 'L1=20', 'L2=30', and 'L3=54', and display data indicated by widths expanding in a direction of the second axis is generated and displayed on the display 131. Graphs indicating fluctuations of a cumulative delay value in a path and fluctuations of delay dispersion in the path are explained hereinafter.

The receiving unit 505 receives a graph showing fluctuations of a cumulative delay value in a path and a specification input specifying an object to be displayed on the display 131. Specification of an object to be displayed is input by a user operating the inputting device 120, such as the keyboard 121 or the mouse 122. A condition entry display shown in FIG. 7 for specification input is explained hereinafter.

Specifically, the receiving unit 505 receives a specification input that specifies a graph showing fluctuations of dispersions of delay, slack, slew, and/or load capacity of circuit elements forming the path.

The displaying unit 507 displays a graph showing fluctuations of a cumulative delay value in the path in response to the specification input received by the receiving unit 505 and a graph showing fluctuations of dispersions of, at least, one of delay, slack, slew, and load capacity of circuit elements forming the path.

Specifically, the generating unit 506 generates a graph showing the dispersion of, at least, one of delay, slack, slew, and load capacity of the circuit elements, based on the computation result by the computing unit 504 and in response to the specification input received by the receiving unit 505, and then the displaying unit 507 displays the generated graph on the display 131.

The displaying unit 507 may display a graph showing fluctuations of dispersion of, at least, one of delay, slack, slew, and load capacity aggregated from a first circuit element to an arbitrary circuit element in a path as well as a graph showing fluctuations of a cumulative delay value in the path.

The displaying unit 507 may also display a graph formed by combining graphs showing fluctuations of a cumulative delay value in a path and fluctuations of dispersion of delay, slack, slew, and/or load capacity in the path by associating, on a coordinate plane, cumulative delay values of circuit elements with delay dispersions of the circuit elements.

The receiving unit 505 receives a specification input specifying delay sensitivity, which indicates the effect of the delay of each of the circuit elements forming a path on the delay of the entire path, as an object to be displayed. Delay sensitivities in STA and SSTA are explained. In STA, when the delay value of one circuit element is reduced by 10 ps, the delay value of the entire path is reduced by 10 ps.

On the other hand, in SSTA, when the delay value of one circuit element is reduced by 10 ps, the delay value of the entire path is not necessarily reduced by 10 ps, but by varying times (e.g., 5 ps). Delay sensitivity is an indicator of the ratio of delay value reduction of the entire path to delay value reduction of the circuit element.

For example, if a reduction of the delay value of an entire path is 5 ps when delay value of a circuit element is reduced by 10 ps, the delay sensitivity is expressed as '0.5 (max.: 1)' or '50% (max.: 100%)'.

Thus, the delay sensitivity of a circuit element may take various values for individual circuit elements. Therefore, graphical display of the delay sensitivities of individual circuit elements helps a user intuitively understand the delay sensitivities.

In the case that the receiving unit 505 receives a specification input specifying delay sensitivity as an object to be displayed, the displaying unit 507 displays a graph showing fluctuations of delay value in a path and also displays a graph showing fluctuations of the delay sensitivities in the path. The latter is displayed by associating, on a coordinate plane, the delay sensitivities, which indicate the effect of delay of circuit elements forming the path on the delay of the entire path, with positions of the circuit elements.

Specifically, the generating unit 506 reads, from the circuit element library 200, information concerning the delay sensitivities of circuit elements and generates a graph showing fluctuations of the delay sensitivities, and the displaying unit 507 displays the generated graph showing fluctuations of the delay sensitivity.

The receiving unit 505 receives a specification input specifying information concerning mutual correlation among circuit elements in a path as an object to be displayed. In the case that cumulative delay values of circuit elements are statistically handled, the cumulative delay values of neighboring circuit elements have dispersion characteristics similar to each other. Mutual correlations among circuit elements are indicators (correlation coefficients) that represent similarities among the dispersion characteristics.

For example, the closer the proximity of one circuit element to another, the greater the correlation coefficient is, and when the dispersion characteristic of one circuit element changes, dispersion characteristic of the other circuit element also changes in a similar manner. When the correlation coefficient is small, if dispersion characteristic of one circuit element changes, dispersion characteristic of the other circuit element does not necessarily change in a similar manner.

When the receiving unit 505 receives a specification input specifying the correlation as an object to be displayed, the displaying unit 507 displays a graph showing fluctuations of a cumulative delay value in a path and information concerning mutual correlations among circuit elements in the path by associating the graph with positions of circuit elements.

Specifically, the generating unit 506 reads, from the circuit element library 200, a correlation table (e.g., correlation table 220) that shows mutual correlations among circuit elements in the path and generates display data based on the correlation table, storing the display data in the memory. The displaying unit 507 reads the graph generated by the generating unit 506 and displays the graph on the display 131.

The receiving unit 505 receives a specification input to display a graph showing fluctuations of delay analysis results for the circuit 300 analyzed by both STA and SSTA. The resulting graph shows fluctuations of cumulative delay values by both STA and SSTA superimposed on the same coordinate plane.

The receiving unit 505 receives a specification input specifying information indicating target performance of the circuit 300 as an object to be displayed. The displaying unit 507 then displays a graph showing fluctuations of a cumulative delay value in a path and a graph showing target performance of the circuit 300.

Specifically, the generating unit 506 reads, from the circuit element library 200, information concerning the target performance of the circuit 300 and generates display data based on the target performance, storing the display data in a memory. The displaying unit 507 reads the graph generated by the generating unit 506 and displays the graph on the display 131.

The receiving unit 505 receives a specification input to respectively display, in divided display areas obtained by dividing the display area on a display screen, graphs showing fluctuations of cumulative delay values in a plurality of paths in the circuit 300.

The displaying unit 507 then generates a plurality of divided display areas by dividing the display area on the display screen and displays, in each of the divided display areas, graphs showing fluctuations of the cumulative delay values in the plurality of paths in the circuit 300.

Further, the receiving unit 505 receives a specification input to display superimposed graphs showing fluctuations of cumulative delay values in paths before and after modification of the circuit design. The displaying unit 507 then displays a graph showing fluctuations of a cumulative delay value in a path and a graph showing a cumulative delay value in a path before modification of circuit design of the circuit 300.

Specifically, the acquiring unit 501 additionally acquires a delay analysis result of the circuit 300 before modification of the circuit design. The extracting unit 502 additionally extracts, from the delay analysis results of the circuit 300 before modification, information concerning cumulative delay values of circuit elements that form an arbitrary path in the circuit 300.

The generating unit 506 reads, from the memory, information concerning the cumulative delay values of circuit elements before modification and generates a graph showing fluctuations of a cumulative delay value in the path. The displaying unit 507 displays the graph on the display 131.

The circuit element library 200 may store circuit element information 200-1 to 200-n before and after modification of circuit design of the circuit 300. In this case, the displaying unit 507 may display a graph showing fluctuations of delay dispersion in a path before modification on the display 131.

The receiving unit 505 receives a specification input specifying a graph that shows fluctuations of probability densities of delay values of the circuit elements by color gradation, as an object to be displayed. The displaying unit 507 then displays a graph showing fluctuations of a cumulative delay value in a path and also displays, by associating the graph with cumulative delay values of circuit elements, a graph showing fluctuations of probability densities of delay values of the circuit elements by color gradation.

Specifically, the generating unit 506 reads probability density distribution of delay of circuit elements from the memory and generates a graph showing fluctuations of probability density of delay values of the circuit elements by color gradation. The displaying unit 507 displays the graph on the display 131.

Figure 6:
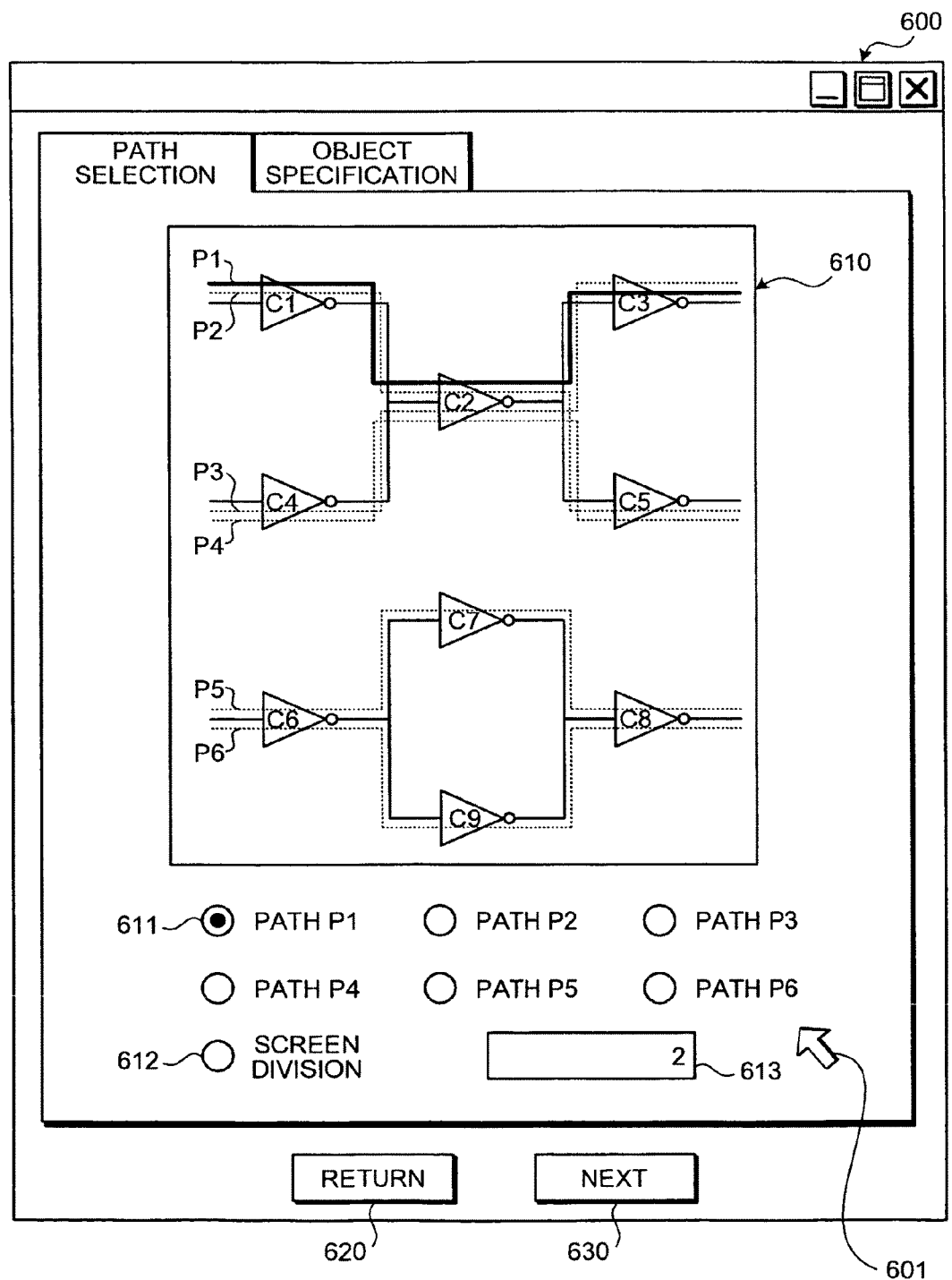
FIG. 6 is a schematic of an exemplary path selection display.

FIG. 6 is a schematic of an exemplary path selection display. A path selection display 600 is for selecting an arbitrary path in the circuit 300. Circuit information 610 of the circuit 300 is displayed with reference to a netlist of the circuit 300.

A path may be arbitrarily selected by moving a cursor 601 on the path selection display 600 and arbitrarily clicking a path button. A path P1 in the circuit 300 is selected in this example as a path P1 button 611 has been clicked.

In the case that multiple paths are selected, division of the display screen may be specified by moving the cursor 601 and clicking a display division button 612. In this case, graphs showing fluctuations of cumulative delay value of the plurality of paths selected are individually displayed in each of divided display areas.

A desired number of divided display areas may be input by moving the cursor 601 and clicking an input box 613. By moving the cursor 601 and clicking a return button 620 or a next button 630, a partial circuit of the circuit 300 to be displayed on the path selection display 600 may be changed.

Figure 7:
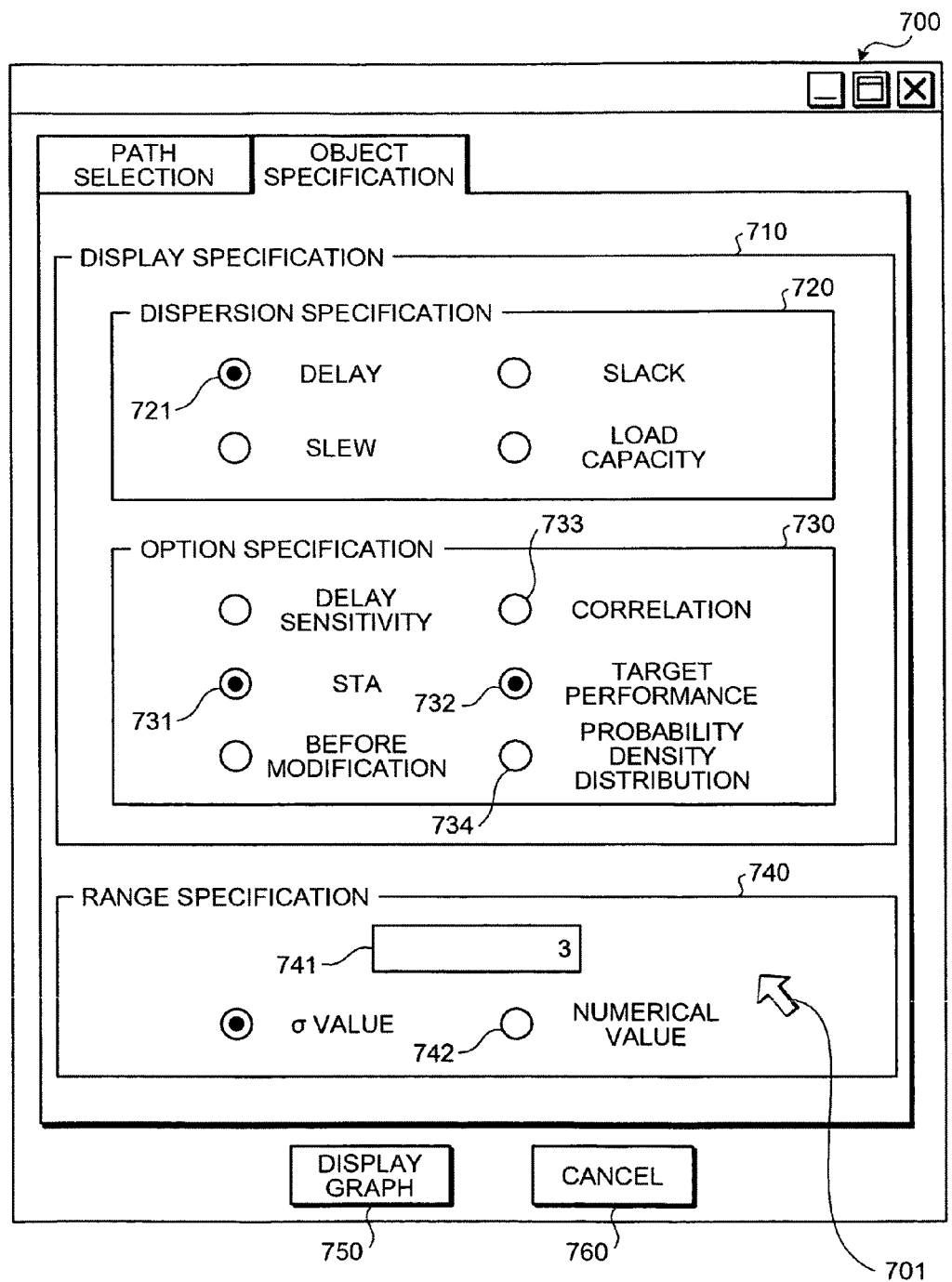
FIG. 7 is a schematic of an exemplary condition entry display.

FIG. 7 is a schematic of an exemplary condition entry display. The condition entry display 700 is for specifying a graph showing fluctuations of a cumulative delay value in a path and an object to be displayed on the display 131.

In the condition entry display 700, an object to be displayed may be arbitrarily specified by moving a cursor 701 and clicking any button (delay, slack, slew, load capacity, delay sensitivity, correlation, STA, target performance, before modification, and probability density distribution) in a display specification field 710.

For example, by moving the cursor 701 and clicking one of a plurality of buttons in a dispersion specification field 720, a graph showing fluctuations of dispersion of delay, slack, slew, and/or load capacity in a path may be displayed. A graph showing fluctuations of delay in a path is displayed in this example as a delay button 721 has been clicked.

By moving the cursor 701 and arbitrarily clicking a button among a plurality of buttons in an option specification field 730, information concerning delay sensitivity, correlation, STA, target performance, before modification, and/or probability density distribution may be displayed on the display 131.

A graph showing fluctuations of a cumulative delay value in a path based on an analysis result obtained by STA and a graph showing target performance of the circuit 300 are displayed in this example as an STA button 731 and a target performance button 732 have been clicked.

By moving the cursor 701 and clicking an input box 741 in a range specification field 740, a dispersion range may be input for delay, slack, slew, and/or load capacity to be displayed on the display 131. A dispersion range of delay value is '3σ value' in this example as '3' has been input in the input box 741.

The dispersion range may also be specified by a specific value (e.g., time in ps). When specifying a dispersion range by a specific value, a value is arbitrarily input to the input box 741 after clicking a numeric button 742.

After the input of various conditions has been completed, information based on the input conditions is displayed on the display 131 by moving the cursor 701 and clicking a display graph button 750. The display may be shifted to the path selection display 600 shown in FIG. 6 by clicking a cancel button 760.

By moving the cursor 701 and clicking a correlation button 733 in the option specification field 730, e.g., a window is displayed to specify circuit elements for which the correlation is to be expressed. A user may either select correlation between arbitrary circuit elements on this window or specify correlation between circuit elements representing a correlation coefficient greater than or equal to a predetermined threshold by setting the predetermined threshold.

By moving the cursor 701 and clicking a probability density distribution button 734 in the option specification field 730, a window is displayed to specify a circuit element for which a graph showing fluctuations of probability density of delay value. A user may specify an arbitrary circuit element in a path on this window.

Figure 8:
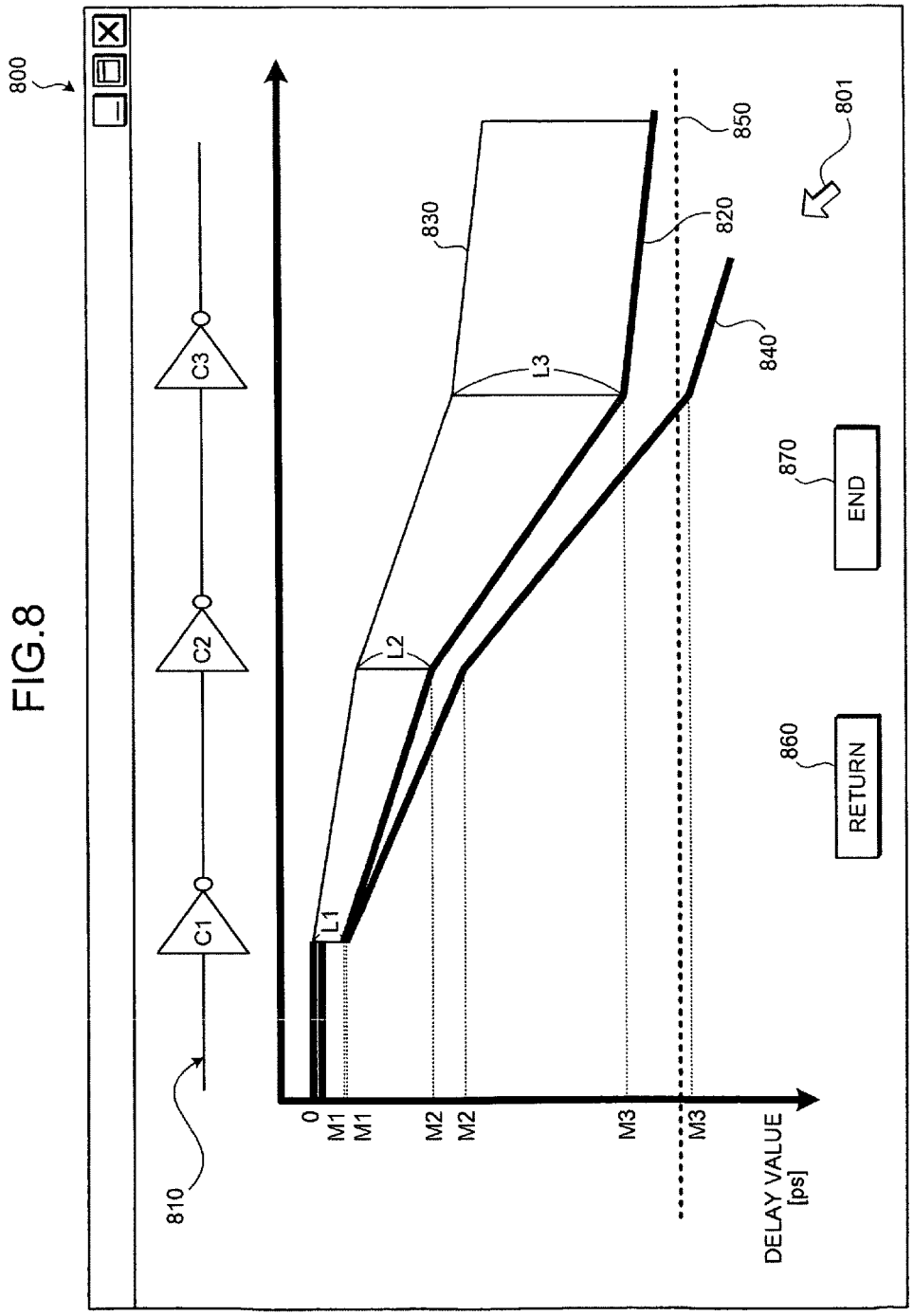
FIG. 8 is a schematic of a first example of a delay analysis result display.

FIG. 8 is a schematic of a first example of a delay analysis result display. A delay analysis result of the path P1 in the circuit 300 is displayed on a delay analysis result display 800.

The delay analysis result display 800 is displayed on the display 131 in the case that the path P1 is selected on the path selection display 600 and the delay button 721, the STA button 731, and the target performance button 732 are clicked, and '3σ value' is specified as a range on the condition specification display 700.

Specifically, circuit information 810 is displayed being associated with positions of the circuit elements C1, C2, and C3 that form the path P1, in the path P1 on the delay analysis result display 800. A graph 820 showing fluctuations of a cumulative delay value in the path P1 is displayed, being associated with the circuit information 810, on a coordinate plane formed by a first axis that specifies positions of the circuit elements C1, C2, and C3 in the path P1 and a second axis that indicates cumulative delay values of the circuit elements C1, C2, and C3.

The graph 820 is graphed by associating cumulative delay values of the circuit elements C1, C2, and C3 obtained from an SSTA result of the circuit 300 with positions of the circuit elements C1, C2, and C3 in the path P1. Thus, by displaying the graphed fluctuations of a cumulative delay value in the path P1, a user may intuitively determine a bottleneck circuit element in the path P1.

The delay analysis result display 800 also displays a graph 830 showing fluctuations of cumulative delay dispersion in the path P1. Thus, by displaying the graphed fluctuations of cumulative delay dispersion in the path P1, a user may intuitively determine a circuit element having a greater delay dispersion.

A user may collectively determine fluctuations of cumulative delay values and cumulative delay dispersions of the circuit elements C1, C2, and C3 by displaying a graph obtained by combining the graph 820 showing fluctuations of the cumulative delay value in the path P1 and the graph 830 showing fluctuations of the cumulative delay dispersion in the path P1.

Specifically, the graph 830 shows fluctuations of a delay value accumulated from the circuit element C1 to the circuit element C3 in the path P1. Cumulative delay dispersions of the circuit elements C1, C2, and C3 are expressed based on indicators L1, L2, and L3 indicating cumulative delay dispersions of the circuit elements C1, C2, and C3.

The graph 830 shows cumulative delay dispersions of the circuit elements C1, C2, and C3 by a graphically indicated dispersion range corresponding to the indicators L1, L2, and L3, thereby enabling the user to intuitively determine that delay dispersion becomes great at the circuit element C3.

A graph 840 is displayed on the same coordinate plane, by associating the cumulative delay value of the circuit elements C1, C2, and C3 obtained from an STA result of the circuit 300 with positions of the circuit elements C1, C2, and C3 in the path P1. Therefore, the user can intuitively determine differences in analysis results between SSTA and STA.

A dotted line 850 is indicated on the same coordinate plane to show target performance of the circuit 300, thereby enabling the user to intuitively determine whether the circuit 300 satisfies the target performance.

By moving a cursor 801 on the delay analysis result display 800 and clicking a return button 860, the display shifts to the condition entry display 700 shown in FIG. 7. Display of a delay analysis result may be ended by moving the cursor 801 on the delay analysis result display 800 and clicking an end button 870.

In the case that a graph showing fluctuations of any of slack, slew, and load capacity is specified on the condition entry display 700, a graph based on the specification is displayed on the display 131 in the same fashion as the graph 830.

Figure 9:
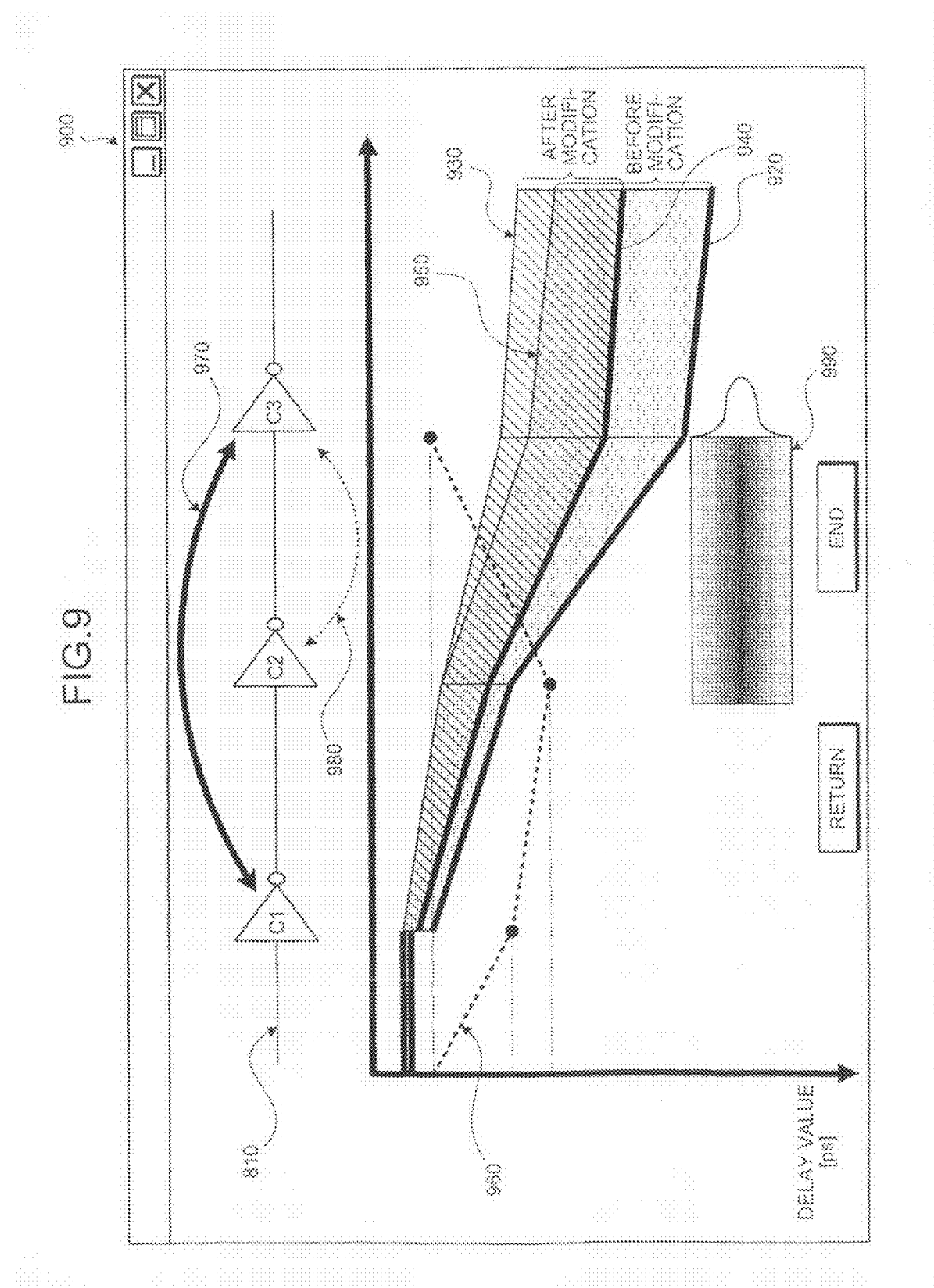
FIG. 9 is a schematic of a second example of a delay analysis result display.

FIG. 9 is a schematic of a second example of a delay analysis result display. A delay analysis result of the path P1 is displayed on a delay analysis result display 900. Explanations identical to the delay analysis result display 800 of FIG. 8 are omitted.

The delay analysis result display 900 is displayed on the display 131 in the case that the path P1 is selected on the path selection display 600 and the delay button 721, the delay sensitivity button, the correlation button 733, the before modification button, and the probability density distribution button 734 are clicked, and '3σ value' is specified as a range on the condition specification display 700.

Specifically, graphs 920 and 940 showing fluctuations of cumulative delay values in the path P1 before and after modification of circuit design of the circuit 300 are displayed on the delay analysis result display 900, being associated with the circuit information 810. Graphs 930 and 950 are also displayed to show fluctuations of cumulative delay dispersions in the path P1 before and after the modification.

The graphs 930 and 950 show fluctuations of cumulative delay dispersions in the path P1 after and before the modification, respectively.

Thus, by displaying superimposed graphs 920 and 940 showing fluctuations of cumulative delay values in the path P1 before and after the modification and graphs 930 and 950 showing fluctuations of cumulative delay dispersions in the path P1 after and before the modification, a user may intuitively determine how delay is affect as a result of the modification of circuit design.

A graph 960 showing delay sensitivity is also displayed on the same coordinate plane to indicate the effect of the delays of the circuit elements C1, C2, and C3 on the delay of the entire path P1, thereby enabling the user to intuitively determine which circuit element in the path P1 has great delay sensitivity. The user may intuitively determine that delay sensitivity of the circuit element C2 in the path P1 is the greatest in this example.

Double-headed arrows 970 and 980 are displayed being associated with the circuit information 810 to show mutual correlation between circuit elements in the path P1. As shown in FIG. 2B, the correlation coefficient of mutual correlation between the circuit elements C1 and C3 is '0.8' and the correlation coefficient of mutual correlation between the circuit elements C2 and C3 is '0.1'.

Specifically, this indicates that the mutual correlation between the circuit elements C1 and C3 is stronger compared to the mutual correlation between the circuit elements C2 and C3. Hence, the double-headed arrow 970 interconnecting the circuit elements C1 and C3 drawn by a thick solid line and the double-headed arrow 980 interconnecting the circuit elements C2 and C3 is drawn by a thin dotted line.

Thus, the user can intuitively determine mutual correlation among circuit elements by the degree of correlations between circuit elements that are expressed by the characteristics (dotted line, thick solid line, etc.) of the double-headed arrows interconnecting the circuit elements.

A graph 990 is displayed on the same coordinate plane indicating, by color gradation, fluctuations of probability density of a delay value of the circuit element C3, being associated with a cumulative delay value of the circuit element C3. Expression by color gradation enables the user to intuitively determine a condition of probability distribution of delay value of the circuit element C3.

Figure 10:
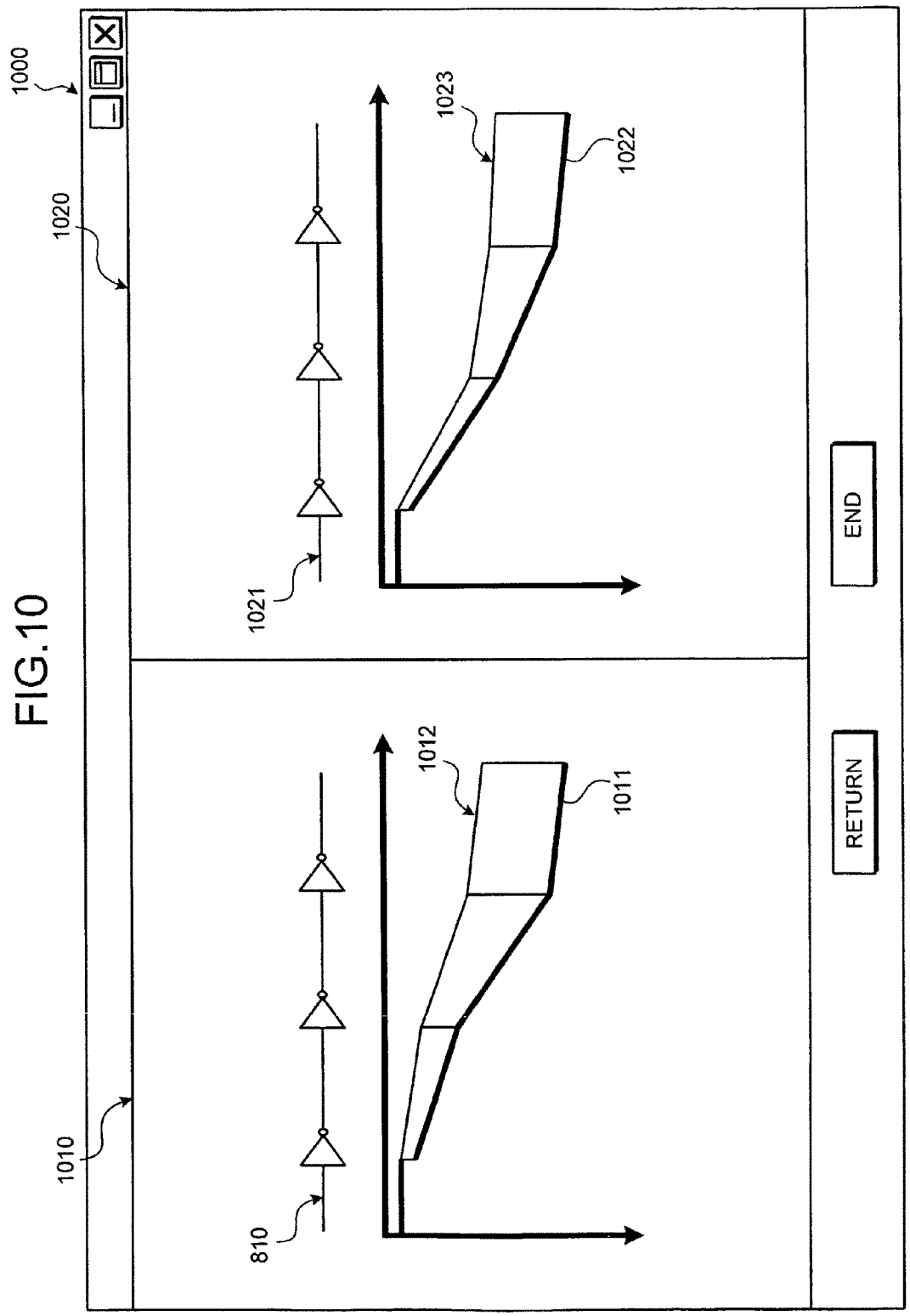
FIG. 10 is a schematic of a third example of a delay analysis result display.

FIG. 10 is a schematic of a third example of a delay analysis result display. A delay analysis result display 1000 is displayed on the display 131 in the case that the paths P1 and P3 are selected and the display division button 612 is clicked on the path selection display 600.

The delay analysis result display 1000 respectively displays, on divided display areas 1010 and 1020, graphs 1011 and 1022 showing fluctuations of cumulative delay values and graphs 1012 and 1023 showing cumulative delay dispersion, being associated respectively with circuit information 810 and 1021.

Specifically, the divided display area 1010 displays the graph 1011 showing fluctuations of the cumulative delay value in the path P1 and the graph 1012 showing fluctuations of the cumulative delay dispersion in the path P1, being associated with the circuit information 810 for the path P1.

The divided display area 1020 displays the graph 1022 showing fluctuations of the cumulative delay value in the path P3 and the graph 1023 showing fluctuations of the cumulative delay dispersion in the path P3, being associated with the circuit information 1021 for the path P3.

Thus, a user can intuitively determine differences in the delay analysis results between different paths (paths P1 and P3) as delay analysis results can be displayed side by side on the same display screen when a plurality of paths are selected.

A dispersion range of a graph showing fluctuations of dispersion of delay, slack, slew, and load capacity may be arbitrarily set. Specifically, the range may be arbitrarily specified by clicking the input box 741 on the condition entry display 700 shown in FIG. 7.

Figure 11:
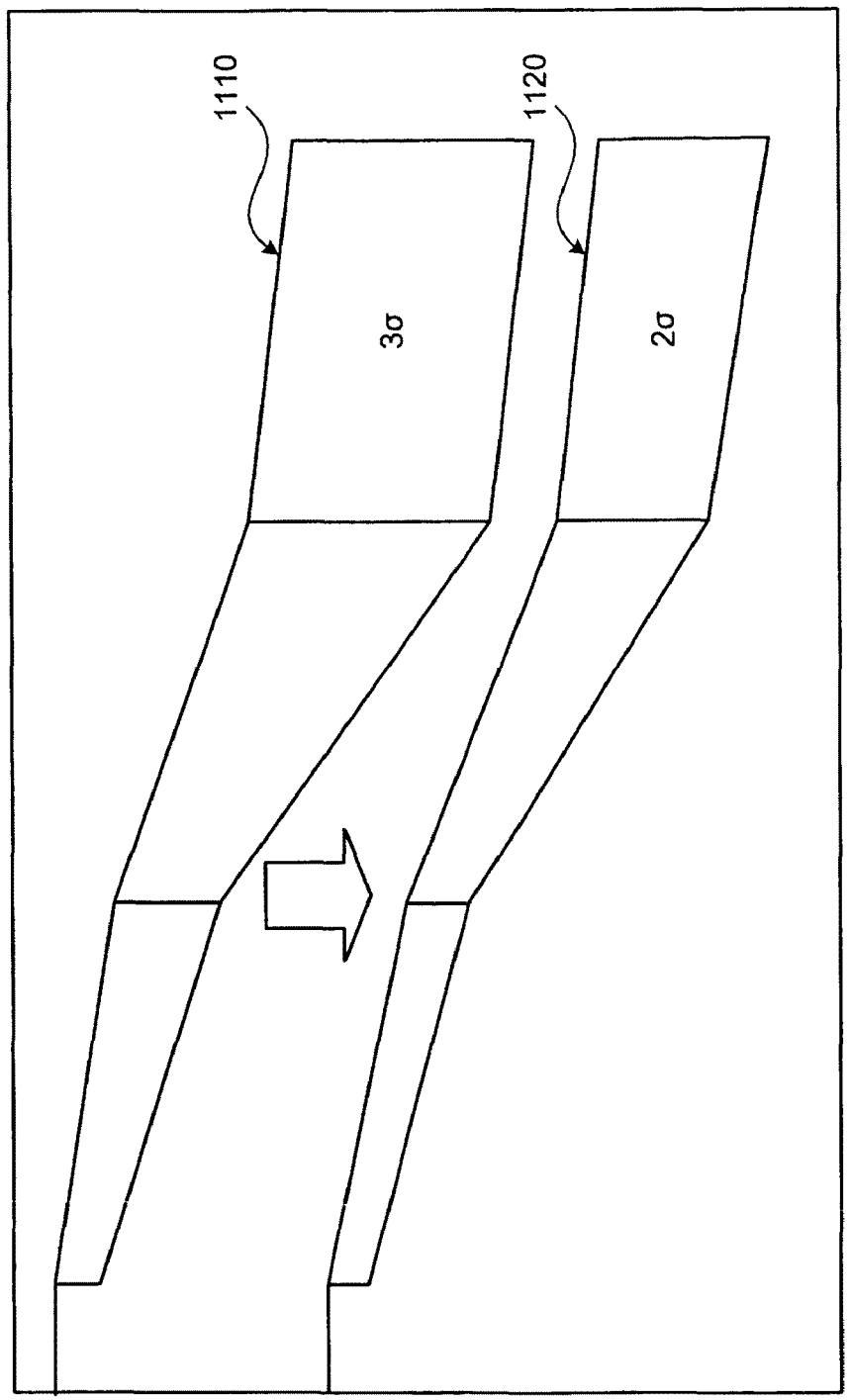
FIG. 11 is a schematic of graphs showing fluctuations of cumulative delay dispersion in a path.

FIG. 11 is a diagram of graphs showing fluctuations of cumulative delay dispersion in a path. Graphs 1110 and 1120 are displayed, to which '3σ value' or '2σ value' has been respectively assigned for the cumulative delay dispersion range in one path. As shown in FIG. 11, expression of the cumulative delay dispersion in a path changes if the range of cumulative delay dispersion is changed.

Graphs in various forms showing fluctuations of cumulative delay dispersion in a path may be displayed by arbitrarily specifying a dispersion range on the condition entry display 700. Thus, by operating the condition entry display 700, a user may arbitrarily set an optimal dispersion range to intuitively understand fluctuations of cumulative delay dispersions of circuit elements.

Figure 12:
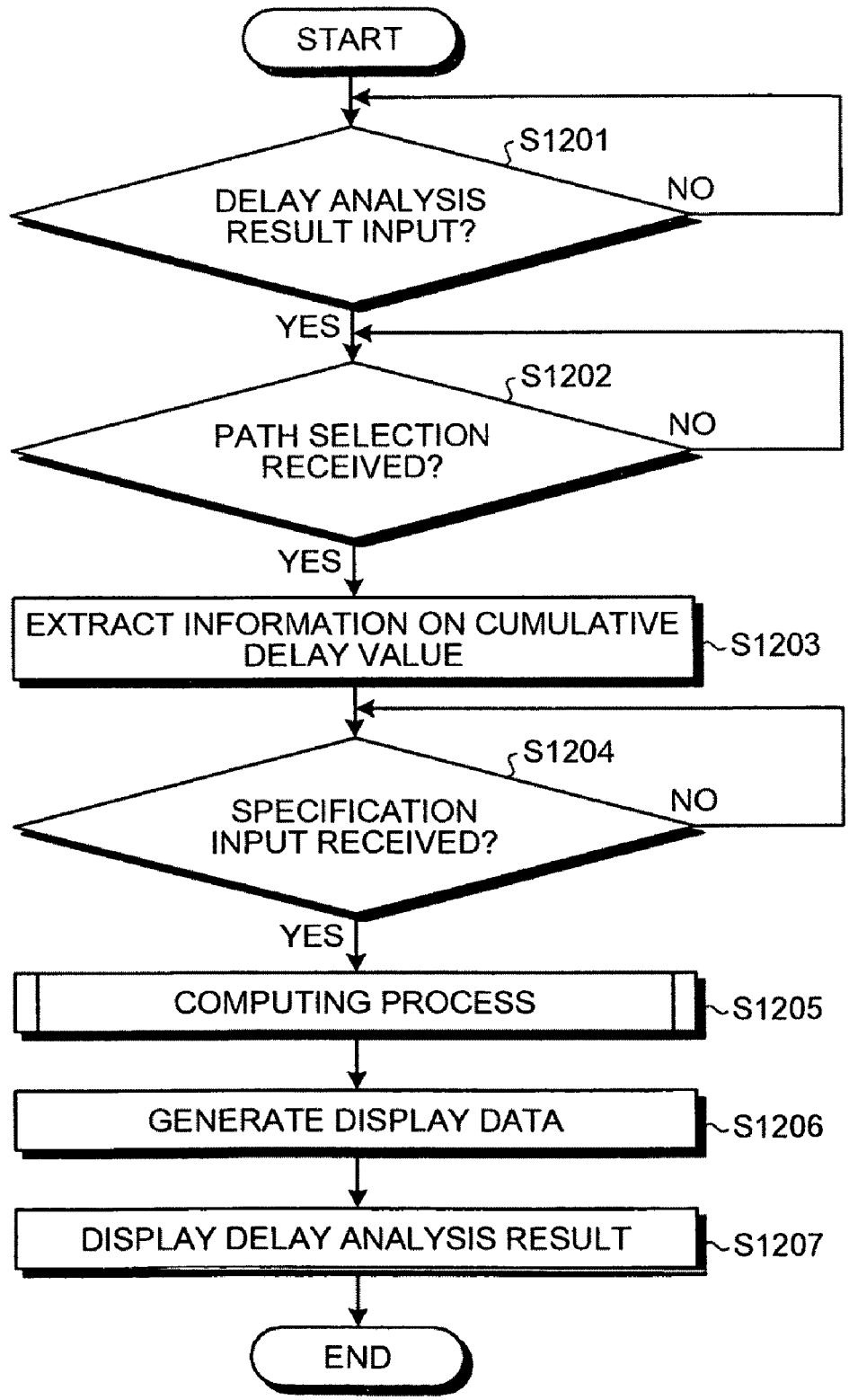
FIG. 12 is a flowchart of delay analysis result display processing.

FIG. 12 is a flowchart of a delay analysis result displaying protocol of the device 100.

The device 100 determines whether a delay analysis result of a circuit has been input (step S1201). Specifically, the device 100 determines whether the acquiring unit 501 has acquired a delay analysis result of a circuit.

The device 100 waits for input of a delay analysis result (step S1201: NO). When a delay analysis result is input (step S1201: YES), the device 100 determines whether the selecting unit 503 has received selection of an arbitrary path in the circuit (step S1202).

When it is determined that selection has not been received, the device 100 waits for selection of a path (step S1202: NO). When it is determined that selection has been received (step S1202: YES), the extracting unit 502 extracts information concerning cumulative delay value of circuit elements forming the path selected at step S1202 (step S1203).

The device 100 determines whether the receiving unit 505 has received a specification input for conditions for displaying a delay analysis result on the display 131 (step S1204). When it is determined that selection has not been received, the device 100 waits for reception of the input (step S1204: NO), and when it is determined that selection has been received (step S1204: YES), the computing unit 504 executes a computing protocol (step S1205).

The generating unit 506 generates display data based on a computation result computed at step S1205 (step S1206). The displaying unit 507 then displays the delay analysis result of the circuit based on the conditions for which specification input is received at step S1204 (step S1207), ending a series of processes.

Although selection of a path in the circuit was to be received at step S1202, an arbitrary path may be automatically selected, and information concerning cumulative delay values of circuit elements forming the automatically selected path may be extracted at step S1203.

Figure 13:
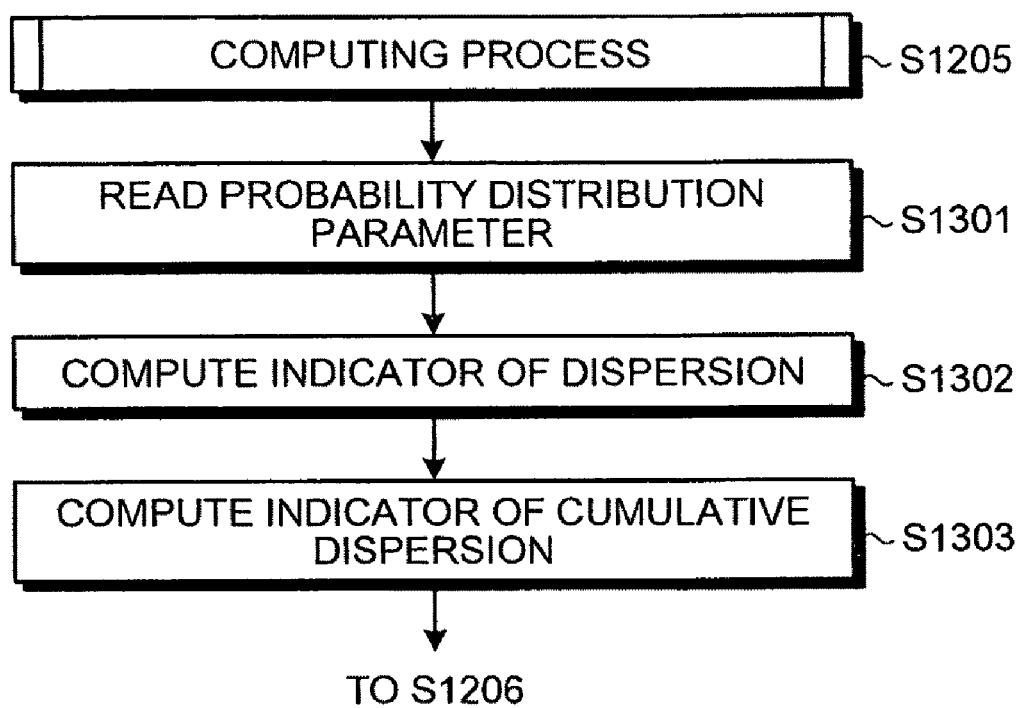
FIG. 13 is a flowchart of a computing protocol at step S1205.

FIG. 13 is a flowchart of a computing protocol at step S1205. A probability distribution parameter of one of delay, slack, slew, or load capacity, for which specification input was received at step S1204 shown in FIG. 12, is read from the circuit element library 200 (step S1301).

Indicators (corresponding to Gn) indicating dispersions of one of delay, slack, slew, or load capacity of circuit elements are computed using the read probability distribution parameter (step S1302).

Indicators (corresponding to Ln) indicating cumulative dispersions of one of delay, slack, slew, or load capacity of circuit elements are computed (step S1303), and the process proceeds to the step S1206 shown in FIG. 12.

When selection of a path is received at the step S1202 shown in FIG. 12, the computing unit 504 may execute a computing process respectively for the delay, slack, slew, and load capacity of the circuit elements forming the path and store the computation results in the memory. In this case, after the step S1204, the generating unit 506 reads a computation result from the memory in response to a specification input and generates display data based on the computation result.

Thus, according to the embodiment of the present invention graphed fluctuations of a cumulative delay value in an arbitrary path in a circuit and fluctuations of cumulative dispersions of delay, slack, slew, and load capacity in the path can be displayed.

In addition to these graphs, according to the embodiment of the present invention a graph showing fluctuations of delay sensitivity that indicates the effect of the delays of the circuit elements on the delay over the entire path, as well as information concerning mutual correlations among circuit elements in the path, target performance of the circuit, etc. can also be displayed.

Therefore, the intuitive understanding of a user may be improved concerning delay analysis results of a circuit and characteristics of various dispersions, and efficiency in delay analysis and circuit design may be improved.

According to the embodiment described above, reduced design load and a shortened design period are possible by assisting a user to easily interpret delay analysis results.

The delay analysis result display method described in the present embodiment can be implemented by a computer such as a personal computer and a workstation executing a program that is prepared in advance. This program is recorded on a computer-readable recording medium such as a hard disk, a flexible disk, a CD-ROM, an MO, and a DVD, and is executed by being read out from the recording medium by a computer. This program can be a transmission medium that can be distributed through a network such as the Internet.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A non-transitory computer-readable recording medium storing therein a computer program for displaying delay analysis results of a target circuit and that causes a computer to execute:
    displaying, on a display screen, a coordinate plane including a first axis indicating a position of a circuit element in a path of the target circuit and a second axis indicating a cumulative delay value of the circuit element; and
    displaying, on the coordinate plane, the delay analysis results in a form of a first graph showing fluctuations of a cumulative delay value in the path,
    wherein the displaying includes displaying a second graph showing fluctuations of sensitivity in the path by a corresponding plot of a delay sensitivity that indicates an effect of delay of the circuit element on delay over the path entirely and the position of the circuit element.

2. The non-transitory computer-readable recording medium according to claim 1, wherein
    the displaying includes displaying a third graph showing fluctuations of a delay dispersion in the path, by a corresponding plot of a dispersion obtained from a probability density distribution of delay of the circuit element and the position of the circuit element.

3. The non-transitory computer-readable recording medium according to claim 2, wherein the third graph shows cumulative fluctuations of the delay dispersion in the path from a first circuit element to an arbitrary circuit element.

4. The non-transitory computer-readable recording medium according to claim 2, wherein
    the displaying includes displaying a combination of the first graph and the third graph, correspondingly plotting the cumulative delay value of the circuit element and the delay dispersion of the circuit element.

5. The non-transitory computer-readable recording medium according to claim 1, wherein
    the displaying includes displaying a fourth graph showing fluctuations of a slack dispersion in the path, by a corresponding plot of a dispersion obtained from a probability density distribution of slack of the circuit element and the position of the circuit element.

6. The non-transitory computer-readable recording medium according to claim 5, wherein the fourth graph shows cumulative fluctuations of the delay dispersion in the path from a first circuit element to an arbitrary circuit element.

7. The non-transitory computer-readable recording medium according to claim 5, wherein
    the displaying includes displaying a combination of the first graph and the fourth graph, correspondingly plotting the cumulative delay value of the circuit element and the slack dispersion of the circuit element.

8. The non-transitory computer-readable recording medium according to claim 1, wherein
the displaying includes displaying a fifth graph showing fluctuations of a slew dispersion in the path by a corresponding plot of a dispersion obtained from a probability density distribution of slew of the circuit element and the position of the circuit element.

9. The non-transitory computer-readable recording medium according to claim 8, wherein the fifth graph shows cumulative fluctuations of the delay dispersion in the path from a first circuit element to an arbitrary circuit element.

10. The non-transitory computer-readable recording medium according to claim 8, wherein
the displaying includes displaying a combination of the first graph and the fifth graph, correspondingly plotting the cumulative delay value of the circuit element and the slew dispersion of the circuit element.

11. The non-transitory computer-readable recording medium according to claim 1, wherein
the displaying includes displaying a sixth graph showing fluctuations of a load capacity dispersion in the path by a corresponding plot of a dispersion obtained from a probability density distribution of load capacity of the circuit element and the position of the circuit element.

12. The non-transitory computer-readable recording medium according to claim 11, wherein the sixth graph shows cumulative fluctuations of the delay dispersion in the path from a first circuit element to an arbitrary circuit element.

13. The non-transitory computer-readable recording medium according to claim 11, wherein
the displaying includes displaying a combination of the first graph and the sixth graph, correspondingly plotting the cumulative delay value of the circuit element and the load capacity dispersion of the circuit element.

14. The non-transitory computer-readable recording medium according to claim 1, wherein
the displaying includes displaying information concerning mutual correlation among the circuit elements with respect to the positions of the circuit elements within the path.

15. The non-transitory computer-readable recording medium according to claim 1, wherein the displaying includes displaying a seventh graph showing, by a color gradation corresponding to the cumulative delay value of the circuit element, fluctuations of a probability density of the delay value of the circuit element.

16. The non-transitory computer-readable recording medium according to claim 1, wherein the displaying includes displaying an eighth graph showing a target performance of the target circuit.

17. The non-transitory computer-readable recording medium according to claim 1, wherein the displaying includes respectively displaying, in a plurality of divided display areas of the display screen, the first graph for a plurality of paths in the target circuit.

18. The non-transitory computer-readable recording medium according to claim 1, wherein the displaying includes displaying the first graph corresponding to the target circuit before circuit design modification.

19. A device for displaying delay analysis results of a target circuit using a central processing unit, comprising:
a displaying unit that displays, on a display screen, a coordinate plane including a first axis indicating a position of a circuit element in a path of the target circuit and a second axis indicating a cumulative delay value of the circuit element, and on the coordinate plane, displays the delay analysis results in a form of a first graph showing fluctuations of a cumulative delay value in the path, wherein the central processing unit controlling the displaying unit, and
wherein the displaying includes displaying a second graph showing fluctuations of sensitivity in the path by a corresponding plot of a delay sensitivity that indicates an effect of delay of the circuit element on delay over the path entirely and the position of the circuit element.

20. A method for displaying delay analysis results, comprising:
displaying, on a display screen, a coordinate plane including a first axis indicating a position of a circuit element in a path of the target circuit and a second axis indicating a cumulative delay value of the circuit element; and
displaying, on the coordinate plane, the delay analysis results in a form of a first graph showing fluctuations of a cumulative delay value in the path,
wherein the displaying is controlled by a central processing unit, and
wherein the displaying includes displaying a sixth graph showing fluctuations of sensitivity in the path by a corresponding plot of a delay sensitivity that indicates an effect of delay of the circuit element on delay over the path entirely and the position of the circuit element.

* * * * *